United States Patent
Chuah et al.

(10) Patent No.: US 9,980,381 B2
(45) Date of Patent: May 22, 2018

(54) METHOD AND APPARATUS FOR INTRINSICALLY SAFE CIRCUIT BOARD ARRANGEMENT FOR PORTABLE ELECTRONIC DEVICES

(71) Applicant: MOTOROLA SOLUTIONS, INC, Schaumburg, IL (US)

(72) Inventors: Seng Huan Chuah, Pulau Pinang (MY); Friedrich Josef Bollmann, Brandenburg (DE); Khai Jin Choo, Air Itam (MY); Weng Kong Hor, Penang (MY); Sih Hau Tan, Penang (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 377 days.

(21) Appl. No.: 14/571,369

(22) Filed: Dec. 16, 2014

(65) Prior Publication Data
US 2016/0174377 A1    Jun. 16, 2016

(51) Int. Cl.
| | |
|---|---|
| H05K 1/11 | (2006.01) |
| H05K 1/14 | (2006.01) |
| H04M 1/02 | (2006.01) |
| H05K 5/06 | (2006.01) |
| H05K 1/02 | (2006.01) |

(52) U.S. Cl.
CPC .......... *H05K 1/144* (2013.01); *H04M 1/0277* (2013.01); *H05K 5/064* (2013.01); *H05K 1/0215* (2013.01); *H05K 1/0224* (2013.01); *H05K 1/14* (2013.01); *H05K 2201/041* (2013.01); *H05K 2201/042* (2013.01); *H05K 2201/043* (2013.01); *H05K 2201/045* (2013.01); *H05K 2201/10371* (2013.01); *H05K 2201/10409* (2013.01); *H05K 2201/2018* (2013.01)

(58) Field of Classification Search
CPC .... H05K 1/14; H05K 1/144; H05K 2201/041; H05K 2201/042; H05K 2201/043; H05K 2201/045; H05K 2201/10371; H05K 9/0024
USPC ....... 361/784, 785, 790, 791, 796, 800, 803, 361/804
See application file for complete search history.

(56) References Cited

U.S. PATENT DOCUMENTS

| | | | |
|---|---|---|---|
| 6,317,330 B1 * | 11/2001 | Portman | H05K 7/142 257/723 |
| 7,489,524 B2 * | 2/2009 | Green | H05K 3/366 361/803 |
| 8,649,165 B2 | 2/2014 | Frey et al. | |
| 9,363,892 B2 * | 6/2016 | Steuer | H05K 9/0022 |
| 2006/0181827 A1 | 8/2006 | Dudnikov et al. | |

(Continued)

FOREIGN PATENT DOCUMENTS

EP    1524710 A2    4/2005

*Primary Examiner* — Binh Tran
(74) *Attorney, Agent, or Firm* — Barbara R. Doutre; Scott M. Garrett

(57) ABSTRACT

A method and circuit board arrangement for an intrinsically safe portable device includes two or more circuit boards having a frame structure that forms a contiguous boundary around a space between the circuit boards. In the space there are circuit components mounted on both circuit boards, and a connector that connect the two circuit boards. An encapsulant material fills the space bounded by the frame structure between the circuit boards to exclude airborne material from coming into contact with the encapsulated circuit components.

22 Claims, 6 Drawing Sheets

(56) References Cited

U.S. PATENT DOCUMENTS

| | | |
|---|---|---|
| 2008/0054435 A1 | 3/2008 | Mehta et al. |
| 2008/0180871 A1 | 7/2008 | Hebert et al. |
| 2009/0180263 A1 | 7/2009 | Eriksen et al. |
| 2009/0218666 A1* | 9/2009 | Yang ................. H01L 21/56 257/677 |
| 2009/0251867 A1* | 10/2009 | Sharma ............... H04Q 1/08 361/737 |

* cited by examiner

METHOD AND APPARATUS FOR INTRINSICALLY SAFE CIRCUIT BOARD ARRANGEMENT FOR PORTABLE ELECTRONIC DEVICES

BACKGROUND OF THE INVENTION

Portable electronic devices such as portable two-way radio devices are typically designed with size being an important consideration. It is desirable to keep the size of the device as small as is reasonably possible, given other considerations. This necessarily means the electrical and electronic components are arranged to be in close proximity to each other inside the device. While this is a conventional design approach for most applications, it poses some issues for applications where a device is to be used safely in an atmosphere including volatile components. Such potentially hazardous conditions can be found, for example, in chemical processing operations, mining, petroleum refineries, and so on. In the event such conditions arise, people in such areas may need to communicate. Accordingly, communication devices for use in such conditions need to be designed so as to avoid ignition of volatile components that may be dispersed in the atmosphere around the device.

The term "intrinsic safety" refers to the design of devices such that they are intrinsically incapable of causing ignition of volatile atmospheric components (e.g. gases, fumes, dust). To accomplish this there are several considerations that must be addressed, and among them are energy storage and the ability of a component to reach a temperature that can cause ignition. Energy storage refers to, for example, the storage of charge in capacitors and the storage of flux in inductive components. In considering a given design it is assumed that storage components can experience faults (i.e. sudden short or open circuit conditions) which cause near-instant release of the energy stored in the component. Accordingly, the ability of a design to store energy must be such that a sudden release of energy cannot cause a sufficiently energetic event to cause ignition. Similarly, components are examined to determine their thermal response to fault conditions, and whether the component can achieve an ignition temperature.

There are various ways for dealing with potential fault conditions in the design on intrinsically safe products. One way is to use redundant limiting circuits that prevents voltage and/or current levels above a threshold that could potentially result in excessive energy storage. Another way is to use oversized components for heat dissipation to ensure that even under fault conditions a particular component cannot achieve a sufficiently high temperature. However such circuits add to the already complex circuitry of the device, and can cause signal degradation.

Another means for dealing with potential fault conditions and thermal considerations is to encapsulate circuit components to reduce the chance of fault conditions and to exclude gasses or other volatile airborne components from being in contact with circuit components. Conventional encapsulation techniques involve spraying an encapsulant material onto circuit boards, or dipping circuit boards in encapsulant material until a sufficiently thick layer of encapsulant can be cured on the circuit board covering circuit components. While the result of this method of encapsulation is effective, it consumes a considerable amount of space in a multi-circuit board architecture due to each of the circuit boards being separately encapsulated. Furthermore, additional protection on the connections between circuit boards (i.e. connectors, flex, pins, etc) is required on both side of the circuit boards. it is not desirable from a manufacturing point of view due to variances in the process and amount of handling that is required.

Accordingly, there is a need for a method and apparatus for encapsulating circuitry for intrinsically safe applications that provides a space saving solution which avoids the need for additional protection circuits on the connections between circuit boards, and which provides the necessary robustness on the surface of the encapsulant material.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
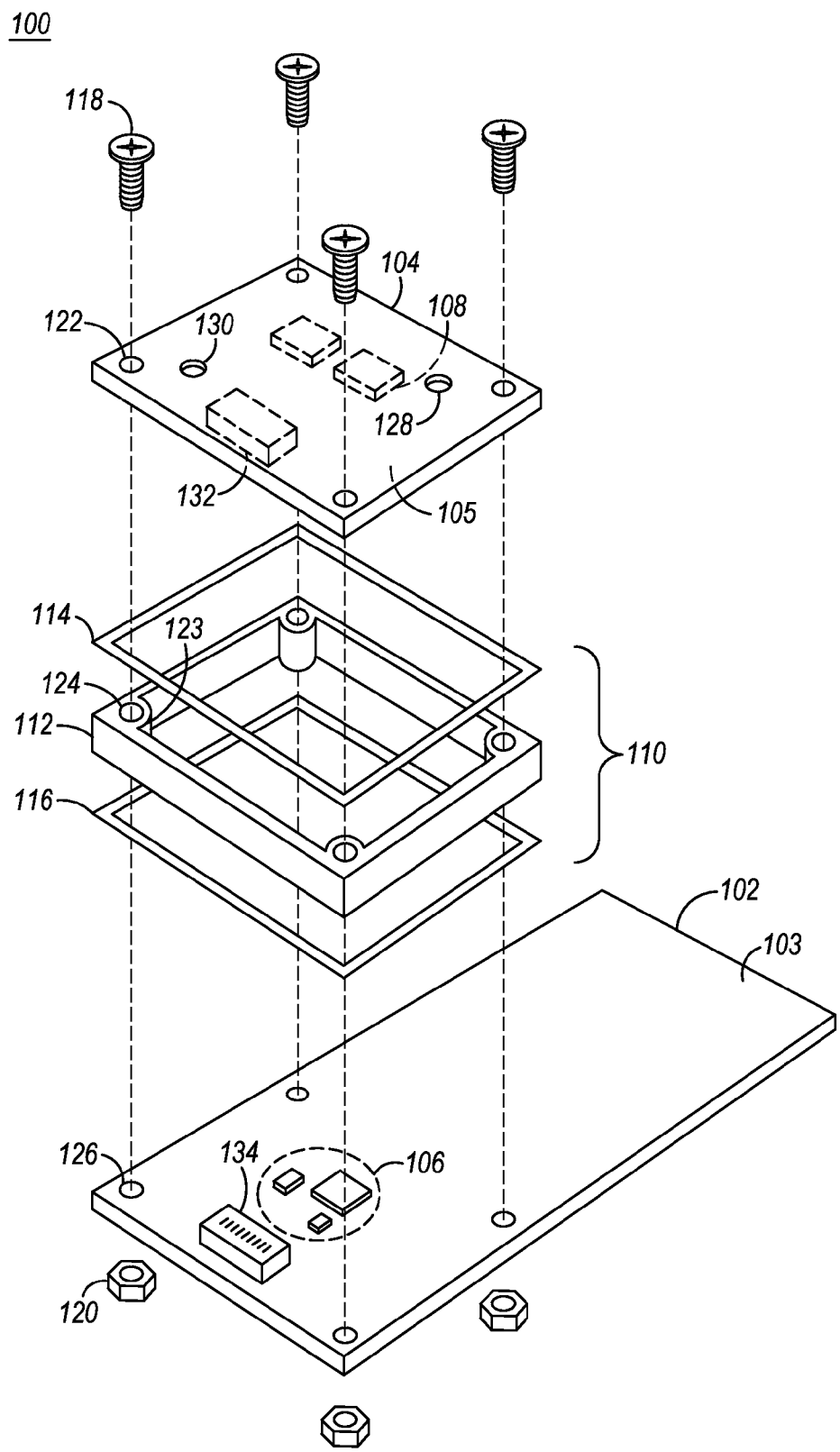
FIG. 1 is an isometric exploded view of an intrinsically safe circuit board arrangement, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Embodiments include an intrinsically safe circuit board arrangement for a portable two-way radio device. The circuit board arrangement can include a first circuit board that has circuit components mounted on a top surface. The circuit board arrangement can further include a frame structure mounted on the top surface of the first circuit board, where the frame structure is contiguous around the circuit components on the top surface of the first circuit board. The frame structure defines a space bounded by the frame structure in which the circuit components of the first circuit board are mounted. The circuit board arrangement can further include a second circuit board that is positioned over the first circuit board and mounted on top of the frame structure. The second circuit board can likewise have circuit components disposed on a bottom surface of the second circuit board, which will be located within the space bounded by the frame structure and between the two circuit boards. A connector located in the space bounded by the frame structure can electrically connect the first circuit board to the second circuit board. As used here the term "connector" refers to any device or component that electrically connects two individual conductor members together to allow the conduction of electrical current, voltage, or both. Examples of connectors include flexible circuit board member, pogo pins, socket type connects, and so on. To exclude gasses from being in contact with the circuitry mounted on the circuit boards, an encapsulant material is used to fill the volume bounded by the frame structure between the first and second circuit boards. The encapsulant material can be injected through the one of the circuit boards to fill the space bounded by the frame structure between the circuit boards. Upon curing, the encapsulant material becomes solid, and adheres to the circuit components and the circuit board and frame structure.

FIG. 1 is an isometric exploded view of an intrinsically safe circuit board arrangement 100, in accordance with some embodiments. The intrinsically safe circuit board arrangement 100 allows the use of an encapsulant material to encapsulate circuit components and exclude gasses and other matter from being able to come into contact with the circuit components in a way that is suitable for high volume manufacturing and which eliminates the variances associate with hand operations used in the prior art. As is known, encapsulation allows components to be mounted closer together under established guidelines for intrinsically safe designs (e.g. the Atmosphere Explosible—ATEX—directive), compared to non-encapsulated circuitry before a fault between components can be assumed. Furthermore, by excluding gasses and other airborne matter from contact with circuit components, the ability of a component to reach a sufficiently high temperature to cause an ignition is mitigated due to the presence of the encapsulant, and the thermal insulation it provides. Given the various standards and guidelines existing for intrinsically safe designs, it will be appreciated by those skilled in the art that the particular dimensions of the intrinsically safe circuit board arrangement 100 can be adjusted to suit those respective standards. Accordingly, no particular dimension is intended to be implied in the drawings.

A first circuit board 102 includes a top surface 103 on which circuit components 106 are mounted. A second circuit board 104 likewise has circuit components 108 disposed on a bottom surface 105, which faces the top surface 103 of the first circuit board 102. The circuit components 106 and 108 are subject to intrinsically safe design standards. A connector that connects the circuit component 106, 108 between the first and second circuit boards 102, 104 includes a lower connector portion 134 on the first circuit board 102, and a mating upper connector portion 132 on the second circuit board 104. The circuit components 106, 108 and the connector portions 132, 134 are therefore arranged to be between the top surface 103 of the first circuit board 102, and the bottom surface 105 of the second circuit board 104 in a space bounded by a frame structure 110. That is, between the first and second circuit boards 102, 104, a space is defined that is bounded by the frame structure, in which the circuit components 106, 108 and the connector portions are disposed when the circuit board arrangement is assembled.

The frame structure 110 includes a frame member 112, an upper gasket layer 114 and a lower gasket layer 116. The upper gasket layer forms a seal between a top surface of the frame member 112 and the bottom surface 105 of the second circuit board 104, and the lower gasket layer 116 forms a seal between a bottom surface of the frame member 112 and the top surface 103 of the first circuit board 102. In some embodiments the upper and lower gasket layers 114, 116 can be adhesive. The frame member is generally a rigid member that both supports the first and second circuit boards, and also contains encapsulant material when it is first added to the space between the first and second circuit boards 102, 104 that is bounded by the frame structure 110, and can be, for example, plastic or polymeric, metal, or a combination. In some embodiments the circuit components 106, 108 can include components that are either sensitive to radiated signals, or which can produce radiated signals, and the frame member 112 can be formed of an electrically conductive material to act as shielding. In some embodiments the upper and lower gasket layers 114, 116 can be formed of an electrically conductive material, and form an electrical connection to, for example, a ground plane on the respective circuit boards 102, 104 to electrically connect the ground planes between the circuit boards 102, 104 through the frame structure 110 to form a robust electromagnetic shield.

In some embodiments, to assemble the circuit board arrangement 100, fasteners can be used to secure the first and second circuit boards 102, 104 to the frame structure 110. As used here, the term "fastener" refers to components used to fasten or hold the board together, and can include, for example, bolts, screws, clips, ties, and so on. In some embodiments a bolt 118 can pass through openings 122 in the second circuit board 104, 124 in a boss 123 of the frame member 112, and opening 126 in first circuit board 104, and be retained with a nut 120 or equivalent retention means (i.e. pins, split rings, etc.). Fasteners can be used at several locations, depending on the application and particular shape of the frame structure 110. Once so assembled, an encapsulant material can be injected in the space between the circuit boards 102, 104 that is bounded by the frame structure 110, such as through an injection port 128, which is an opening though the second circuit board 104. The encapsulant material is injected in a viscous liquid form that cures to a substantially solid state. To allow injection of the encapsulant material, a vent port 130 through the second circuit board 104 allows air in the space bounded by the frame structure to exit from the space as the encapsulant material fills the space. In some embodiments an encapsulant material which provides sufficient adhesion between boards can be used, and the fasteners are not be required.

Figure 2:
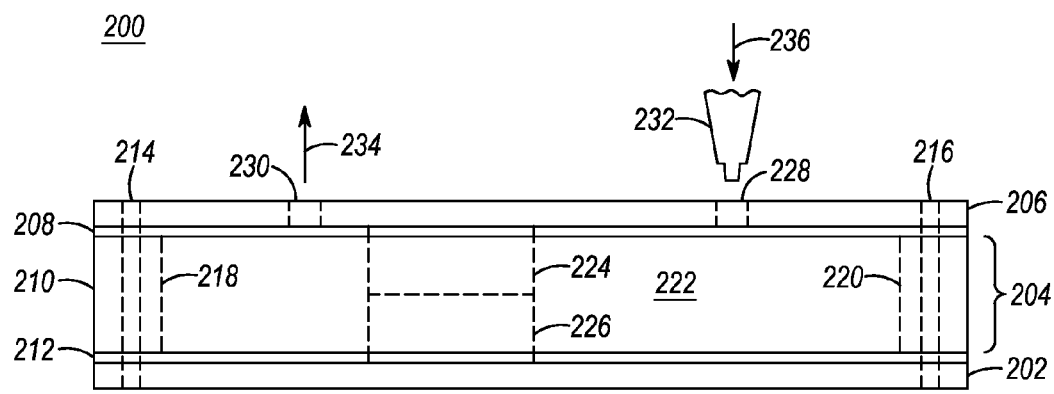
FIG. 2 is a side elevational view of an intrinsically safe circuit board arrangement, in accordance with some embodiments.

FIG. 2 is a side elevational view of an intrinsically safe circuit board arrangement 200, in accordance with some embodiments. The circuit board arrangement 200 can be an example of the circuit board arrangement 100 of FIG. 1 that is partially assembled. A first circuit board 202 and a second circuit board 206 are separated by a frame structure 204. The frame structure 204 includes a first gasket layer 208 between a frame member 210 and the second circuit board 206, and a second gasket layer 212 between the frame member 210 and the first circuit board 202. A space 222 is formed between the first and second circuit boards 202, 206 that is bounded by the frame structure 204 contiguously around the space 222. A connector is disposed in the space 222 and connects several signal paths between the first and second circuit boards 202, 206 and can be comprised of an upper connector portion 224, and a lower connector portion 226. The circuit boards 202, 206, and frame structure 204 can be fastened together with, for example, fasteners that pass through channels 214, 216 through the circuit boards 202, 206 and the frame member 210. The frame member can included boss portions 218, 220 to provided support for the channels 214, 216 passing through the frame member 210.

To inject encapsulant material an injection port 228 can be formed through the second circuit board 206, into which an injection nozzle 232 can be inserted as indicated by arrow 236. As encapsulant material flows from the injection nozzle 232 into the space 222, air in the space 222 that is displaced by the encapsulant material is forced out of a vent hole 230 as indicated by arrow 234. The injection of encapsulant material can be stopped when encapsulant material begins to flow out of the vent hole 230, or when a measured volume of encapsulant material has passed through the injection nozzle 232 and delivered into the space 222.

Figure 3:
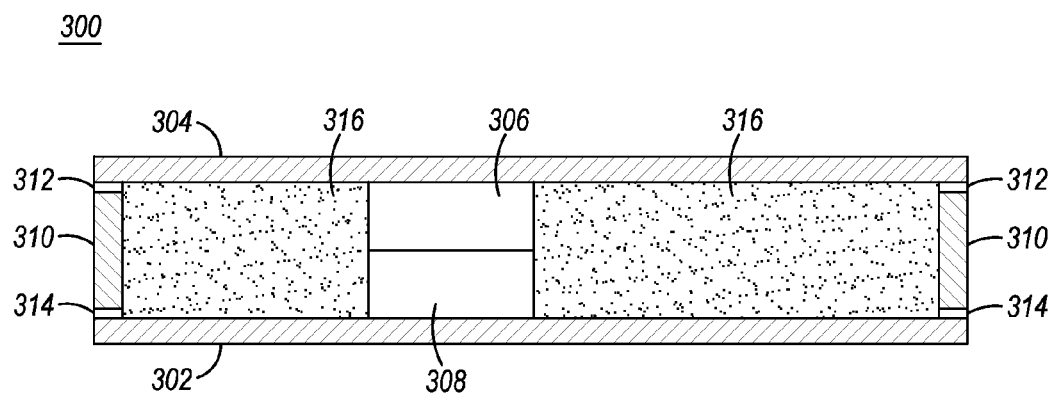
FIG. 3 is a side cut-away view of an intrinsically safe circuit board arrangement with encapsulant, in accordance with some embodiments.

FIG. 3 is a side cut-away view of an intrinsically safe circuit board arrangement 300 with encapsulant 316, in accordance with some embodiments. The circuit board arrangement 300 can be an example of that shown in FIG. 2 after the encapsulant material has been injected and cured. A first circuit board 302 and a second circuit board 304 are separated by a frame structure that includes a frame member 310. An upper gasket layer 312 is disposed between the frame member 310 and the second circuit board 304, and a lower gasket layer 314 is disposed between the frame member 310 and the first circuit board 302. It will be appreciated by those skilled in the that in all embodiments the gasket layers (i.e. 312, 314) are in contact with both the frame member and a circuit board to form a seal that prevents escape of the encapsulant material, and can also provide an electrical connections between a circuit board 302, 304 and the frame member 310 in some embodiments. In some embodiments the upper and lower gasket layers 312, 314 can be adhesive. An upper connector portion 306 on the second circuit board 304 is mated with a lower connector portion 308 on the first circuit board 302. The connector portions 306, 308 provide several conductor paths for electrical connectivity between circuitry on the first circuit board 302 and circuitry on the second circuit board 304. Once the encapsulant material cures, it adheres to the circuit components, and the circuit boards, and prevents airborne matter from coming into contact with the circuit components on the circuit boards 302, 304 as well the conductors in the connector portions 306, 308.

Figure 4:
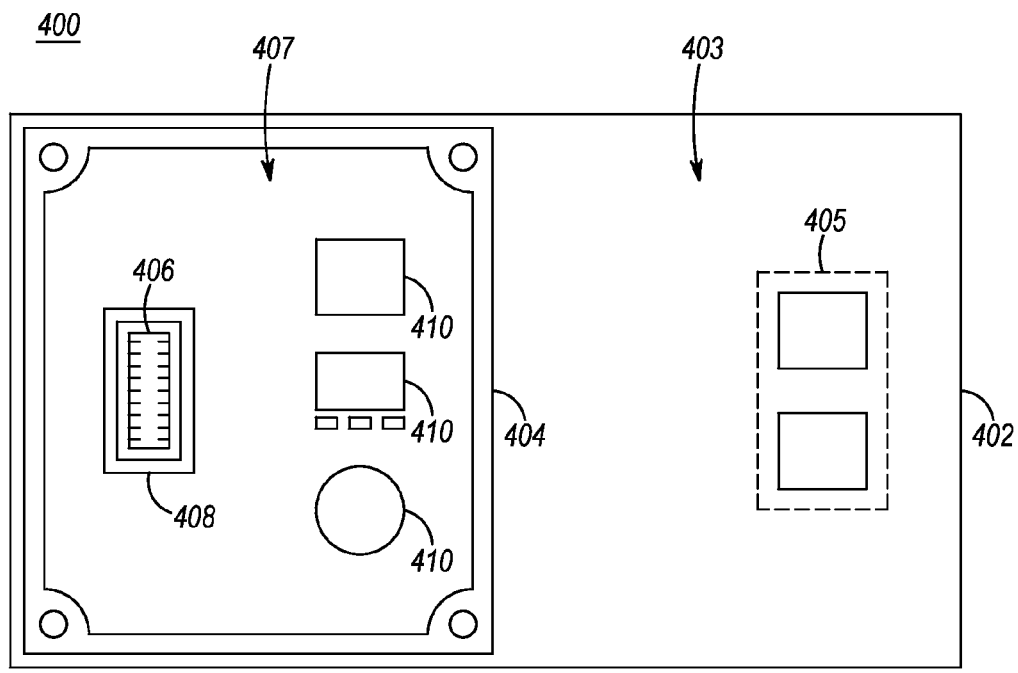
FIG. 4 is a top plan view of a circuit board having a seal around a connector for an intrinsically safe circuit board arrangement, in accordance with some embodiments.

FIG. 4 is a top plan view 400 of a circuit board 402 having a seal member 408 around a connector 406 for an intrinsically safe circuit board arrangement, in accordance with some embodiments. The circuit board 402 can include a first region 403 that includes circuit components 405 that are not to be encapsulated, and a second region 407 that is bounded by a frame structure 404 and which includes circuit components 410 which are to be encapsulated. The connector 406 connects circuitry on the circuit board 402 to circuitry on another board (not shown) that also has circuitry that is to be encapsulated in the space bounded by the frame structure 404. The seal member 408 can be the same height or slightly taller than the frame structure 404, and is contiguous around the connector 406. Thus, when the other circuit board is placed over the frame structure, the seal member 408 seals off the connector 406 to prevent encapsulant material from intruding into the connector 406. The seal member 408 should be sized so as to minimize the free volume within the seal member. The seal member 408 can be made of a rigid or compliant material that is slightly compressed when the circuit boards are assembled so as to form a pressure seal between each circuit board and the seal member 408. The frame structure 404 creates a bounded region 407, in which some circuit components 410 are to be encapsulated. Other circuit components 405 can be located on the circuit board 402 in a region 403 that is outside of the frame structure 404 and which are not to be encapsulated.

Figure 5:
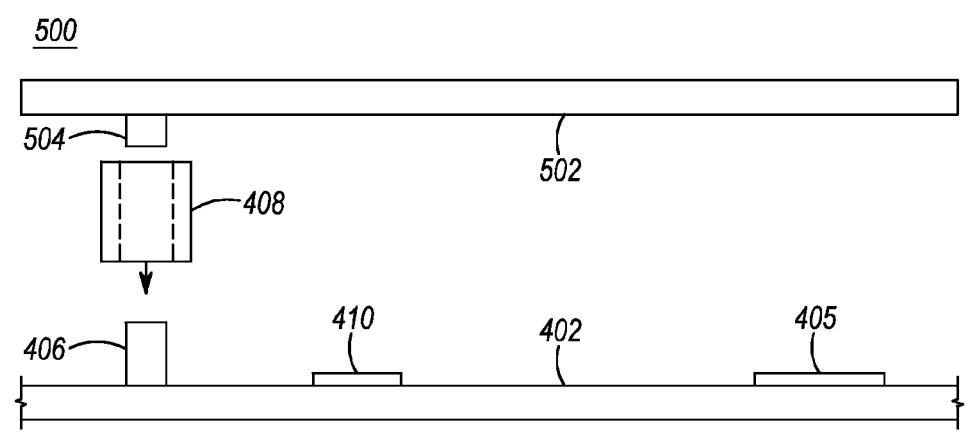
FIG. 5 is a side exploded view of a circuit board having a seal around a connector for an intrinsically safe circuit board arrangement, in accordance with some embodiments.

FIG. 5 is a side exploded view 500 of a circuit board arrangement having a seal member 408 around a connector 406 for an intrinsically safe circuit board arrangement, in accordance with some embodiments. In this view the frame structure 404 is not present in order to show the seal member 408. A second circuit board 502 includes a mating connector 504 that mates with the connector 406 on the first circuit board 402. When the second circuit board 502 is lowered, the mating connector 504 mates with the connector 406, both of which will be surrounded by the seal member 408. The seal member 408 seals the connector 406 and mating connector 504 by being in contact with both the first circuit board 402 and the second circuit board 504 contiguously around the connector 406 and the mating connector 504.

Figure 6:
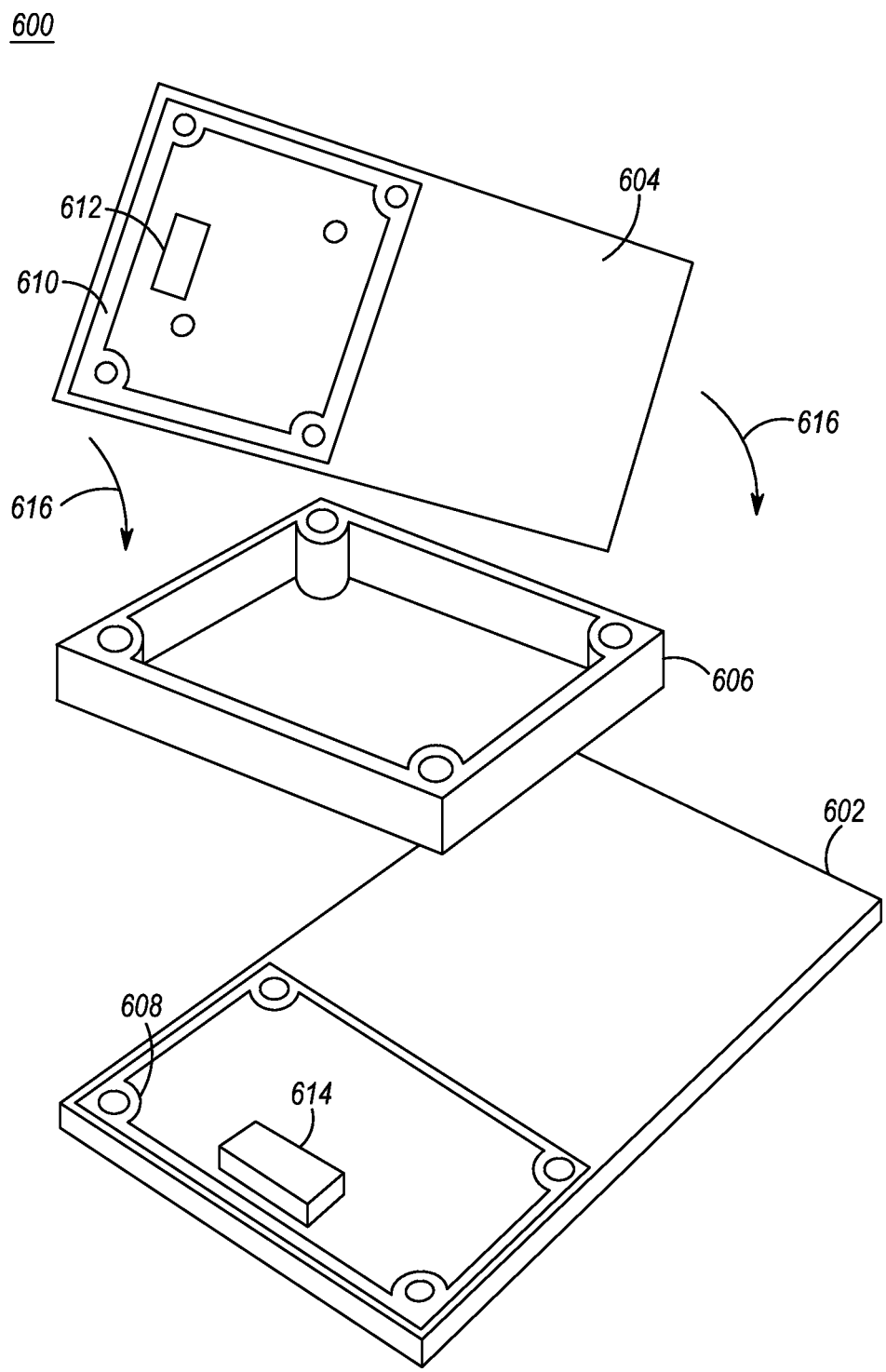
FIG. 6 is an exploded assembly view of an intrinsically safe circuit board arrangement where ground is electrically connected through the frame between the boards, in accordance with some embodiments.

FIG. 6 is an exploded assembly view 600 of an intrinsically safe circuit board arrangement where ground is electrically connected through the frame between the boards, in accordance with some embodiments. In the present circuit board arrangement a first circuit board 602 is connected to a second circuit board 604 through mating connector portions 612, 614. The view of the second circuit board 604 shows the bottom surface of the second circuit board 604, while the top surface of the first circuit board is shown. The second circuit board will be turned down to assemble the circuit board arrangement, as indicated by arrows 616. A frame structure 606 is disposed between first and second circuit boards 602, 604. The frame structure 606 is contiguous around a space between the first and second circuit boards 602, 604, and contains encapsulant material within that space, preventing the encapsulant material from spilling out of the space. In the present example, the frame structure 606 is electrically conductive, and mates with an exposed ground pad 608 on the first circuit board 602, and an exposed ground pad 610 on the second circuit board 604. The exposed ground pads 608, 610 can, as shown, be contiguously shaped like a vertical projection of the frame structure 606. The frame structure 606 can include upper and lower conductive adhesive layers which adhere a frame member to the ground pads 608, 610. Accordingly, a common ground can be shared between the first and second circuit boards 602, 604 through the frame structure 606 while signals and power can be passed between the circuit boards 602, 604 through the connectors 612, 614. At the same time the frame structure 606 and the first and second circuit boards 602, 604 define a space in which an encapsulant material is disposed to encapsulate circuit components mounted in the circuit boards 602, 604 in the space bounded by the frame structure 606. In some embodiments, the exposed ground pads 608, 610 can be the exposed portion of a ground plane that extends across most of the respective circuit board surface area in the region bounded by the frame structure 606, except, for example, directly under the connectors 612, 614, and other circuit components mounted on the circuit boards 602, 604 with the regions bounded by the frame structure 606. Thus, the respective ground planes and the conductive frame structure 606 act as an Electromagnetic Interference (EMI) shield, preventing signals from coupling out of, or into the space bounded by the frame structure and the circuit components which are encapsulated therein, upon assembly of the circuit board arrangement.

Figure 7:
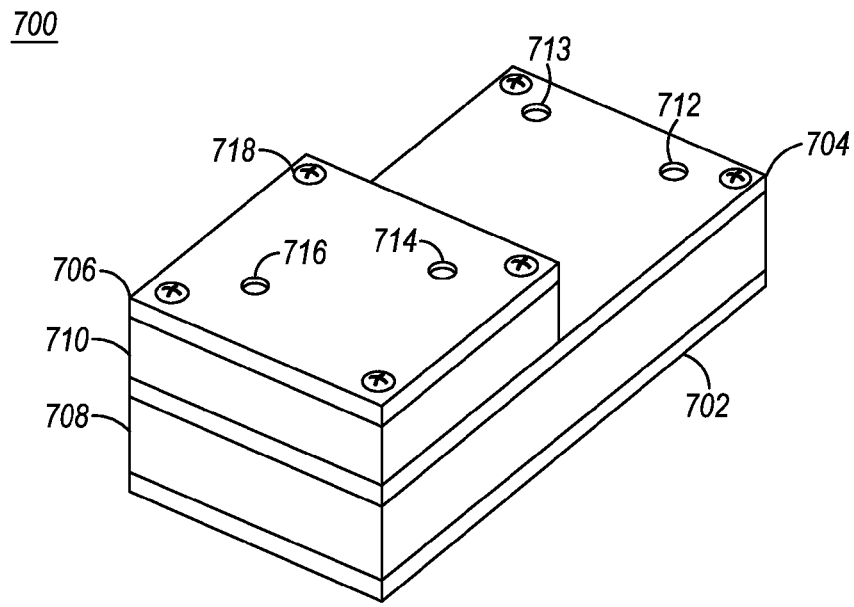
FIG. 7 is an isometric view of an intrinsically safe circuit board arrangement using three circuit boards, in accordance with some embodiments.

FIG. 7 is an isometric view of an intrinsically safe circuit board arrangement 700 using three circuit boards, in accordance with some embodiments. The concepts discussed in regard to FIGS. 1-6 can be extended to additional circuit boards. Thus, the circuit board arrangement 700 includes a first circuit board 702, a second circuit board 704, and a third circuit board 706. The first and second circuit boards 702, 704 are separated by a first frame structure 708, which provides a contiguous boundary around a space between the first and second circuit boards 702, 704. A second frame structure 710 likewise provides a contiguous boundary around a space between the second and third circuit boards 704, 706. A first injection port 712 in the second circuit board 704 can be used to inject encapsulant material into the space bounded by the first frame structure 708 between the first and second circuit boards 702, 704, with a first vent port 713 allowing air to escape as encapsulant material fills the space. A second injection port 714 in the third circuit board 706 likewise allows the injection of encapsulant material into the space bounded by the second frame structure 710 between the second and third circuit boards 704, 706 with a second vent port 716 allowing air to escape as encapsulant material fills the space. Fasteners such as bolts 718 can be used to hold the various circuit boards 702, 704, 706 and frame structures 708, 710 together.

Figure 8:
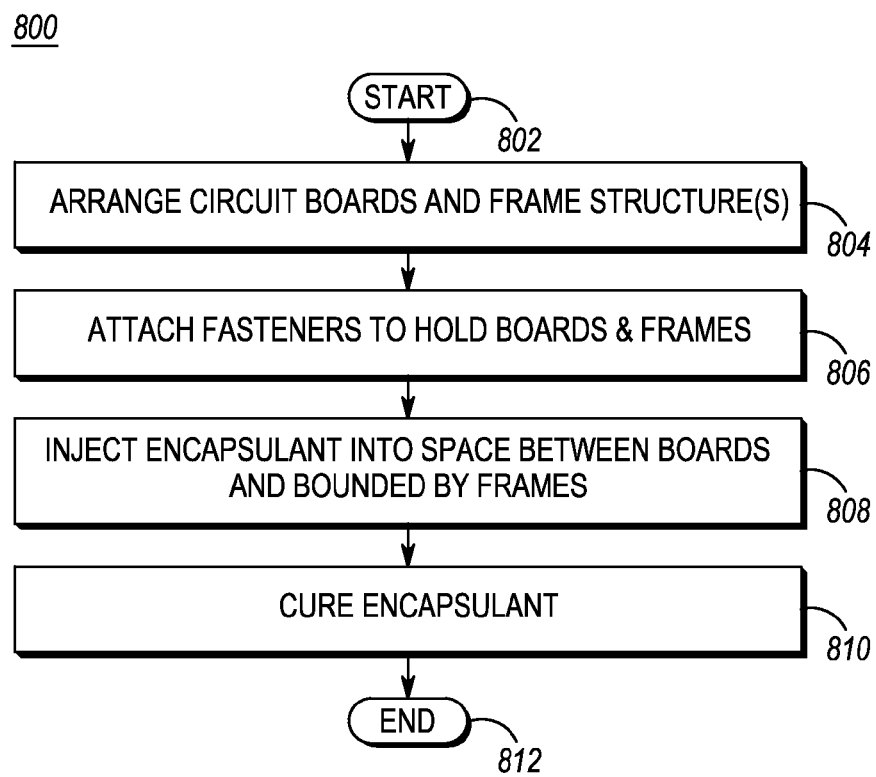
FIG. 8 is a flow chart diagram of a method of forming an intrinsically safe circuit board arrangement, in accordance with some embodiments.

FIG. 8 is a flow chart diagram of a method 800 of forming an intrinsically safe circuit board arrangement, in accordance with some embodiments. The method 800 can be automated or manual, or a combination of manual and automated processes. At the start 802 the various circuit boards and frame structure components are gathered and ready for assembly. In step 804 the frame member is placed at the appropriate location between a first circuit board and a second circuit board. The frame structure can be constructed so as to allow electrical conduction in some embodiments, where the frame structure mates with correspondingly shaped conductor pads on each circuit board. The frame structure provides a contiguous boundary around a space between the first and second circuit boards in which there are circuit components on both the first and second circuit boards, and well as a connector or other connection means between the two circuit boards. In step 806 several fasteners can be assembled through the circuit boards and the frame structure to hold the circuit boards and frame structure together. In general the fasteners exert pressure on the circuit boards to hold them against the frame structure to ensure a sufficient seal is formed contiguously between the frame structure and each circuit board. In step 808 an encapsulant material is injected into the space bounded by the frame structure between the two circuit boards. The encapsulant material can be a binary resinous dielectric material such as, for example, epoxy. Once a sufficient amount of encapsulant material is injected into the space bounded by the frame structure between the circuit boards, the encapsulant material is then allowed to cure in step 810. The curing process can involve subjecting the circuit board arrangement containing the encapsulant material resins to heat in some embodiments. At the end 812, the circuit components on each circuit board in the space bounded by the frame structure between the circuit boards are encapsulated in the cured encapsulant material. As a result, volatile or other potentially flammable airborne materials are unable to come into contact with the encapsulated circuit components.

Figure 9:
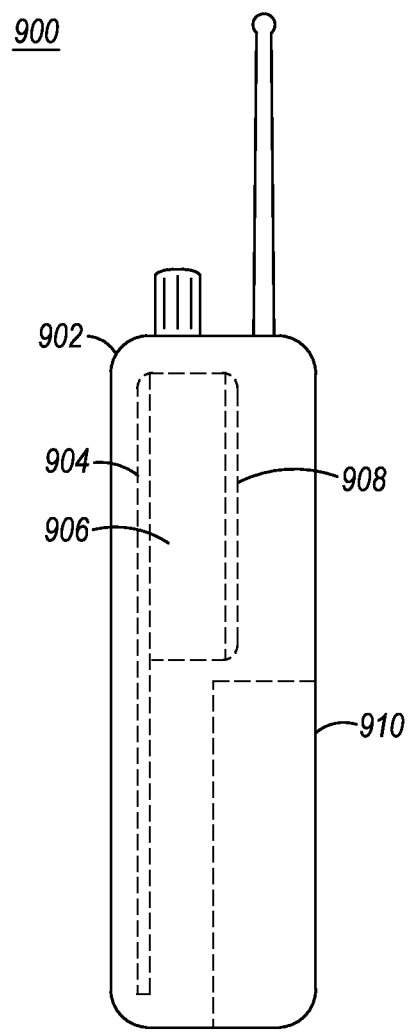
FIG. 9 shows a side elevational view of a portable radio communication device including an intrinsically safe circuit board arrangement, in accordance with some embodiments.

FIG. 9 shows a side elevational view of a portable radio communication device 900 including an intrinsically safe circuit board arrangement, in accordance with some embodiments. The portable radio communication device 900 can be a portable two-way radio communication device, and includes a housing 902 in which circuitry and other components are disposed. In particular, housed within the portable radio communication device 900 is a first circuit board 904, a frame structure 906, and a second circuit board 908, which are shown in side view and dashed line, but which comply with the teachings discussed in regard to one or more of FIGS. 1-8. The frame structure 906 provides a contiguous boundary around a space between the first and second circuit boards 904, 908, which includes circuit components mounted in the circuit boards 904, 908 in the space, and a connector that connects the circuit boards together (i.e. provides signal conductors for various signals and power). The space is filled with an encapsulant material to ensure no airborne materials (e.g. gasses, dust) come into contact with the circuit components encapsulated in the space bounded by the frame structure 906. The two circuit boards 904, 908 allow a compact design, obviating the need for a wider or longer housing. A battery 910 can be used to provide power to the circuitry and circuit components to operate the portable radio communication device 900.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An intrinsically safe circuit board arrangement for a portable two-way radio device, comprising:
   a first circuit board having a plurality of circuit components disposed on a top surface of the first circuit board;
   a frame structure mounted on the top surface of the first circuit board that is contiguous around the plurality of circuit components on the top surface of the first circuit board and defines a space bounded by the frame structure in which the circuit components of the first circuit board are disposed;
   a second circuit board positioned over the first circuit board mounted on top of the frame structure and having a plurality of circuit components disposed on a bottom surface of the second circuit board within the space bounded by the frame structure;
   a connector in the space bounded by the frame structure that electrically connects the first circuit board to the second circuit board;
   an encapsulant material that fills the volume bounded by the frame structure between the first and second circuit boards that exclude gas from the volume bounded by the frame structure;
   an injection port in the second circuit board; and
   a vent port in the second circuit board.

2. The intrinsically safe circuit board arrangement of claim 1, wherein the frame structure comprises an electrically conductive frame member.

3. The intrinsically safe circuit board arrangement of claim 2, wherein the electrically conductive frame member is attached to the first and second circuit boards with conductive adhesive.

4. The intrinsically safe circuit board arrangement of claim 3, wherein the conductive adhesive between the first circuit board and the electrically conductive frame member electrically connects a ground plane of the first circuit board to the electrically conductive frame member, and the conductive adhesive between the second circuit board and the electrically conductive frame member electrically connects a ground plane of the second circuit board to the electrically conductive frame member.

5. The intrinsically safe circuit board arrangement of claim 1, further comprising fasteners that traverse through the first and second circuit boards and the frame structure.

6. The intrinsically safe circuit board arrangement of claim 5, wherein the fasteners are screw-type fasteners.

7. The intrinsically safe circuit board arrangement of claim 1, further comprising a seal member that surrounds the connector and excludes the encapsulant material from the connector, and the seal member forming a pressure seal between the first and second circuit boards.

8. The intrinsically safe circuit board arrangement of claim 1, wherein the frame structure is a first frame structure, the intrinsically safe circuit board arrangement further comprises:
   a plurality of circuit components on a top surface of the second circuit board;
   a second frame structure mounted on the top surface of the second circuit board that is contiguous around the plurality of circuit components on the top surface of the second circuit board and defines a space bounded by the second frame structure in which the circuit components on top of the second circuit board are disposed;
   a third circuit board positioned over the second circuit board mounted on top of the second frame structure and having a plurality of circuit components disposed on a bottom surface of the third circuit board within the space bounded by the second frame structure;
   a connector in the space bounded by the second frame structure that electrically connects the second circuit board to the third circuit board; and
   an encapsulant material that fills the volume bounded by the second frame structure between the second and third circuit boards that exclude gas from the volume bounded by the second frame structure.

9. The intrinsically safe board arrangement of claim 8, wherein the encapsulant material between the first and second circuit boards provides sufficient adhesion to negate any use of fasteners, and the encapsulant material between the second and third circuit boards provides sufficient adhesion to negate any use of fasteners.

10. The intrinsically safe circuit board arrangement of claim 1, wherein the encapsulant material that fills the volume bounded between the frame structure and the first and second circuit boards is adhered to the plurality of components on the top surface of the first circuit board and the plurality of components on the bottom surface of the second circuit board, the top surface of the first circuit board and the bottom surface of the second circuit board and the frame structure.

11. The intrinsically safe board arrangement of claim 1, wherein the encapsulant material provides sufficient adhesion between the first and second circuit boards to negate any use of fasteners.

12. An intrinsically safe portable radio communication device, comprising:
  a housing;
  a circuit board arrangement disposed in the housing comprising:
    a first circuit board having a top surface with a frame structure mounted on the top surface of the first circuit board that is contiguous around a plurality of circuit components on the top surface of the first circuit board, and a second circuit board positioned over the first circuit board mounted on top of the frame structure and having a plurality of circuit components disposed on a bottom surface of the second circuit board within a space bounded by the frame structure between the first and second circuit board;
    a connector in the space bounded by the frame structure that electrically connects the first circuit board to the second circuit board;
    an encapsulant material that fills the space bounded by the frame structure between the first and second circuit boards which exclude airborne material from the space bounded by the frame structure;
  an injection port in the second circuit board; and
  a vent port in the second circuit board.

13. The intrinsically safe portable radio communication device of claim 12, wherein the frame structure comprises an electrically conductive frame member.

14. The intrinsically safe portable radio communication device of claim 13, wherein the electrically conductive frame member is attached to the first and second circuit boards with conductive adhesive.

15. The intrinsically safe portable radio communication device of claim 14, wherein the conductive adhesive between the first circuit board and the electrically conductive frame member electrically connects a ground plane of the first circuit board to the electrically conductive frame member, and the conductive adhesive between the second circuit board and the electrically conductive frame member electrically connects a ground plane of the second circuit board to the electrically conductive frame member.

16. The intrinsically safe portable radio communication device of claim 12, further comprising fasteners that traverse through the first and second circuit boards and the frame structure.

17. The intrinsically safe portable radio communication device of claim 16, wherein the fasteners are screw-type fasteners.

18. The intrinsically safe portable radio communication device of claim 12, further comprising a seal member that surrounds the connector and excludes the encapsulant material from the connector, and the seal member forming a pressure seal between the first and second circuit boards.

19. The intrinsically safe portable communication device of claim 12, wherein the encapsulant material that fills the volume bounded between the frame structure and the first and second circuit boards is adhered to the plurality of components on the top surface of the first circuit board and the plurality of components on the bottom surface of the second circuit board, the top surface of the first circuit board and the bottom surface of the second circuit board and the frame structure.

20. The intrinsically safe portable communication device of claim 12, wherein the encapsulant material provides sufficient adhesion between the first and second circuit boards to negate any use of fasteners.

21. An intrinsically safe circuit board arrangement for a portable two-way radio device, comprising:
  a first circuit board having a plurality of circuit components disposed on a top surface of the first circuit board;
  a frame structure mounted on the top surface of the first circuit board that is contiguous around the plurality of circuit components on the top surface of the first circuit board and defines a space bounded by the frame structure in which the circuit components of the first circuit board are disposed;
  a second circuit board positioned over the first circuit board mounted on top of the frame structure and having a plurality of circuit components disposed on a bottom surface of the second circuit board within the space bounded by the frame structure;
  a connector in the space bounded by the frame structure that electrically connects the first circuit board to the second circuit board;
  an encapsulant material that fills the volume bounded by the frame structure between the first and second circuit boards that exclude gas from the volume bounded by the frame structure;
  wherein the frame structure is a first frame structure, and the intrinsically safe circuit board arrangement further comprises:
  a plurality of circuit components on a top surface of the second circuit board;
  a second frame structure mounted on the top surface of the second circuit board that is contiguous around the plurality of circuit components on the top surface of the second circuit board and defines a space bounded by the second frame structure in which the circuit components on top of the second circuit board are disposed;
  a third circuit board positioned over the second circuit board mounted on top of the second frame structure and having a plurality of circuit components disposed on a bottom surface of the third circuit board within the space bounded by the second frame structure;
  a connector in the space bounded by the second frame structure that electrically connects the second circuit board to the third circuit board; and
  an encapsulant material that fills the volume bounded by the second frame structure between the second and third circuit boards that exclude gas from the volume bounded by the second frame structure;
  a first injection port in the second circuit board;
  a first vent port in the second circuit board;
  a second injection port in the third circuit board; and
  a second vent port in the third circuit board.

22. An intrinsically safe circuit board arrangement for a portable two-way radio device, comprising:
- a first circuit board having a plurality of circuit components disposed on a top surface of the first circuit board;
- a frame structure mounted on the top surface of the first circuit board that is contiguous around the plurality of circuit components on the top surface of the first circuit board and defines a space bounded by the frame structure in which the circuit components of the first circuit board are disposed;
- a second circuit board positioned over the first circuit board mounted on top of the frame structure and having a plurality of circuit components disposed on a bottom surface of the second circuit board within the space bounded by the frame structure;
- a connector in the space bounded by the frame structure that electrically connects the first circuit board to the second circuit board;
- an encapsulant material that fills the volume bounded by the frame structure between the first and second circuit boards that exclude gas from the volume bounded by the frame structure;
- wherein the frame structure is a first frame structure, and the intrinsically safe circuit board arrangement further comprises:
- a plurality of circuit components on a top surface of the second circuit board;
- a second frame structure mounted on the top surface of the second circuit board that is contiguous around the plurality of circuit components on the top surface of the second circuit board and defines a space bounded by the second frame structure in which the circuit components on top of the second circuit board are disposed;
- a third circuit board positioned over the second circuit board mounted on top of the second frame structure and having a plurality of circuit components disposed on a bottom surface of the third circuit board within the space bounded by the second frame structure;
- a connector in the space bounded by the second frame structure that electrically connects the second circuit board to the third circuit board;
- an encapsulant material that fills the volume bounded by the second frame structure between the second and third circuit boards that exclude gas from the volume bounded by the second frame structure; and wherein:
- the encapsulate material that fills the volume bounded between the frame structure and the first and second circuit boards is adhered to the plurality of components on the top surface of the first circuit board and the plurality of components on the bottom surface of the second circuit board, the top surface of the first circuit board and the bottom surface of the second circuit board and the frame structure; and
- the encapsulant material that fills the volume bounded by the second frame structure between the second and third circuit boards is adhered to the plurality of components on the top surface of the second circuit board and the plurality of components on the bottom of the third circuit board, the top surface of the second circuit board and the bottom surface of the third circuit board and the second frame structure.

* * * * *